United States Patent
Theiler et al.

(10) Patent No.: US 11,258,455 B2
(45) Date of Patent: Feb. 22, 2022

(54) ANALOG-TO-DIGITAL CONVERTER AND METHOD TO OPERATE AN ANALOG-TO-DIGITAL CONVERTER

(71) Applicant: ams AG, Premstätten (AT)

(72) Inventors: Helmut Theiler, Premstätten (AT); Herbert Lenhard, Premstätten (AT)

(73) Assignee: AMS AG, Premstätten (AT)

( * ) Notice: Subject to any disclaimer, the term of this patent is extended or adjusted under 35 U.S.C. 154(b) by 0 days.

(21) Appl. No.: 17/052,461

(22) PCT Filed: Apr. 29, 2019

(86) PCT No.: PCT/EP2019/060918
§ 371 (c)(1),
(2) Date: Nov. 2, 2020

(87) PCT Pub. No.: WO2019/211236
PCT Pub. Date: Nov. 7, 2019

(65) Prior Publication Data
US 2021/0175897 A1    Jun. 10, 2021

(30) Foreign Application Priority Data

May 3, 2018   (EP) .................................... 18170636

(51) Int. Cl.
*H03M 3/00*    (2006.01)
(52) U.S. Cl.
CPC ............. *H03M 3/484* (2013.01); *H03M 3/43* (2013.01); *H03M 3/49* (2013.01)
(58) Field of Classification Search
CPC .......... H03M 3/484; H03M 3/43; H03M 3/49; H03M 1/12; H03M 3/30; H03M 3/50

USPC .................................................. 341/143, 155
See application file for complete search history.

(56) References Cited

U.S. PATENT DOCUMENTS

| | | | |
|---|---|---|---|
| 5,187,482 A | 2/1993 | Tiemann et al. | |
| 2003/0034908 A1* | 2/2003 | Nestler | H03M 3/474 341/141 |
| 2008/0191914 A1* | 8/2008 | Van Veldhoven | H03M 3/362 341/139 |

(Continued)

FOREIGN PATENT DOCUMENTS

WO    0105037 A2    1/2001

OTHER PUBLICATIONS

International Search Report and Written Opinion in PCT Application No. PCT/EP2019/060918, dated Jul. 19, 2019, 12 pages.

(Continued)

*Primary Examiner* — Jean B Jeanglaude
(74) *Attorney, Agent, or Firm* — MH2 Technology Law Group LLP

(57) ABSTRACT

An analog-to-digital converter (ADC) is based on single-bit delta-sigma quantization. The ADC includes an integrator, a threshold detector, a feedback block, a range control circuit and an output processing block. The ADC is configured to, based on its own generated digital bitstream, adjust the magnitude of a subtrahend signal in order to achieve autonomous auto-ranging of the ADC during the integration time of a measurement. In particular, the auto-ranging allows for the efficient conversion of an analog input signal with high dynamic range, for example ambient light, to a digital output signal.

16 Claims, 5 Drawing Sheets

(56) References Cited

U.S. PATENT DOCUMENTS

| | | | |
|---|---|---|---|
| 2009/0033533 A1 | 2/2009 | Pai et al. | |
| 2010/0164773 A1 | 7/2010 | Clement et al. | |
| 2011/0074614 A1* | 3/2011 | Ogawa | H03K 5/02 |
| | | | 341/143 |

OTHER PUBLICATIONS

Athar, S. et al. "Design and FPGA Implementation of a 2nd Order Adaptive Delta Sigma Modulator with One Bit Quantization", International conference on Field Programmable Logic applications (FPL), 2010, 6 pages.

Jaggi, M. et al. "Instantaneously adaptive Delta-sigma modulators", Canadian electrical engineering journal, vol. 11, No. 1, 1986, 4 pages.

Ramesh, M. et al. "Sigma Delta Analog to Digital Converters with Adaptive Quanization", IEEE, 1997, 4 pages.

* cited by examiner

ANALOG-TO-DIGITAL CONVERTER AND METHOD TO OPERATE AN ANALOG-TO-DIGITAL CONVERTER

CROSS-REFERENCE TO RELATED APPLICATIONS

The present application is the national stage entry of International Patent Application No. PCT/EP2019/060918, filed on Apr. 29, 2019, which claims the benefit of priority of European Patent Application No. 18170636.7, filed on May 3, 2018, all of which are hereby incorporated by reference in their entirety for all purposes.

BACKGROUND OF THE INVENTION

The present disclosure relates to an analog-to-digital converter based on single-bit delta-sigma quantization and to a method to operate such an analog-to-digital converter.

Signal processing is an essential feature of many electronic devices. Such applications commonly require that low energy consumption is maintained while the employment of off-chip components is avoided. To fulfill these requirements signal processing is preferably performed in the digital domain. Therefore, high resolution low power analog-to-digital converters, ADCs, are required.

A common means to realize the analog-to-digital conversion is the employment of the delta-sigma quantization method. To improve accuracy, delta-sigma quantizers send the digital output of a delta modulation through a 1-bit digital-to-analog converter and sum up a delta portion to the analog input signal. To overcome the resolution limitations of such single-bit delta-sigma quantizers, especially with analog input signals with high dynamic ranges, multi-bit delta-sigma quantizers are generally employed. However, these have the disadvantage that additional circuit elements are needed.

SUMMARY OF THE INVENTION

This disclosure provides an improved concept for an analog-to-digital converter based on single-bit delta-sigma quantization.

The improved concept is based on the idea of providing an ADC having a single-bit delta-sigma quantizer with an automatic ranging feature. This auto-ranging is realized by automatic adaptation of the magnitude of the subtrahend signal based on the information of the digital output of the delta-sigma quantizer.

An ADC according to the improved concept comprises an integrator which is configured to generate an integrated signal by means of an integration of a difference of the input signal and a subtrahend signal, and a threshold detector which is configured to generate discrete bit signals of a bitstream, with the bit signals indicating whether the integration signal is smaller or larger than a first threshold value. The ADC further comprises a feedback block configured to generate the subtrahend signal based on the bit signals, and a range control circuit, RCC, which is configured to adjust, based on the bitstream, a magnitude of the subtrahend signal corresponding to a range value and to provide, for each of the discrete bit signals, an associated range value to an output processing block, OPB. The OPB is configured to generate the digital output signal from the bitstream and from the associated range value for each of the discrete bit signals of the bitstream.

It is the purpose of the feedback block to generate the subtrahend signal which is subtracted from the analog input signal, in correspondence to the generation of each bit signal. This ensures that an overrun, or saturation, of the integrator is avoided. The RCC, on the other hand, realizes the auto-ranging feature of the ADC by analyzing the bit sequence of the bitstream from the threshold detector and correspondingly adjusting the magnitude of the subtrahend signal. This has the effect that the magnitude of the subtrahend signal is appropriately chosen in dependence of the currently prevailing value of the analog input signal. Consequently, a high dynamic range of the single-bit delta-sigma quantizer, and hence of the ADC, is achieved.

In various embodiments of the ADC according to the improved concept, the bitstream is generated within a predefined measurement time and the discrete bit signals of the bitstream are generated at a predefined clock rate.

The measurement time, or integration time, and the clock rate define the length of the generated bitstream. Moreover, the dynamic range of the delta-sigma quantization for a given integration time is determined by the clock rate and the magnitude of the subtrahend signal. The clock rate is generally limited by the settling performance of the components of the delta-sigma quantizer. The magnitude of the subtrahend signal, on the other hand, determines the maximum level of the analog input signal for a given clock rate without saturating the integrator. Typical integration times and clock rates are in the order of 100 ms and 1 MHz, respectively, for light measurements.

As the level of the analog input signal can be much lower than its full scale during periods of the integration time, in particular several orders of magnitude below the maximum level, the subtrahend signal in these periods can likewise be reduced based on information of the bitstream. Consequently, the dynamic range of the delta-sigma quantizer, and hence of the ADC, during the integration time is adapted to the currently prevailing level of the analog input signal. For example, the level of the input signal may be in the order of parts-per-million, ppm, of its maximum level.

In various embodiments according to the improved concept the generation of the digital output signal comprises multiplying each of the discrete bit signals of the bitstream with a factor corresponding to the actual value of the subtrahend signal, represented by the range value.

Acquiring a bitstream in a delta-sigma quantizer with changing magnitude of the subtrahend signal means, that in order to achieve a meaningful digital output signal, each bit signal of the bitstream has to be related to the corresponding range value set for the generation of the respective bit signal. An output processing block therefore has to convert each bit signal of the bitstream using the range value or its inverse as conversion factor.

In various embodiments according to the improved concept, the RCC is further configured to adjust the range value using a factor of a set of fixed factors, in particular of a set of powers of two.

Increasing and decreasing the range value in a single-bit delta-sigma quantizer can be conveniently realized in a multiplicative way by a defined factor. Factors of 2 are thereby especially suitable as they amount to a bit shift in the feedback block by means of the RCC.

In at least one embodiment the RCC is further configured to increase the range value if a sequence of the bitstream comprises a number of consecutive high values and/or a number of consecutive low values and to decrease the range value if the sequence comprises a number of consecutive alternating low and high values and/or a number of consecutive alternating high and low values.

For example, for bipolar input signals a series of consecutive 0s in the bitstream from the threshold detector means that the analog input signal undercuts the set range of the delta-sigma quantizer, for example a large negative signal level. Correspondingly, a series of consecutive 1s in the bitstream implies a too large positive signal. Therefore, in both these cases the range value needs to be increased, leading to a larger range of the delta-sigma quantizer. In contrast, a series of alternating 0s and 1s in the bitstream implies that the input signal is small and well within the set range. The RCC can therefore set the delta-sigma quantizer to a smaller range by decreasing the range value. The number of consecutive values required to trigger a change of the range value is tantamount to the rate at which the auto-ranging feature of the delta-sigma quantizer operates. For example, the RCC is configured to increase the range value after three consecutive 0s or 1s in the bitstream and/or to decrease the range value after three consecutive occurrences of 01 or 10 in the bitstream.

In a development of the embodiment described above, the RCC is further configured to set a polarity of the subtrahend signal based on the bitstream.

For instance, for positive input signals a positive delta is subtracted as the subtrahend signal, while for negative input signals, the subtrahend signal is negative.

In alternative embodiments of the ADC according to the improved concept, the RCC is further configured to increase the range value if a sequence of the bitstream comprises a number of consecutive high values and to decrease the range value if the sequence comprises a number of consecutive low values.

For example, for unipolar signals a series of consecutive 1s in the bitstream from the threshold detector indicates a too large signal level outside the set range of the delta-sigma quantizer. Analogous to the situation of bipolar input signals described above, the RCC in this case sets the delta-sigma quantizer to a larger range by increasing the range value. In contrast, a series of 0s in the bitstream implies for unipolar signals that the input signal is small and within the range. The RCC therefore can set the delta-sigma quantizer to a smaller range by decreasing the range value.

In various embodiments of the ADC according to the improved concept the RCC is further configured to predetermine an initial value for the range value.

Depending on the application and on the properties of the analog input signal to process, an initial setting for the range can be set before the analysis of the input signal by means of the delta-sigma quantizer. For example, for overflow critical systems the initial value for the range value may correspond to the maximum range. Alternatively, the initial range value may be based on a previous measurement, for example it may be set to correspond to the range setting at the end of the previous measurement. In general, the initial range value can be defined by any system-related parameter.

In various embodiments the RCC is further configured to increase and decrease the range value in a different manner.

For a fast changing analog input signal the speed of the auto-ranging of the delta-sigma quantizer is a critical aspect. For example, if ranging up occurs on a too slow timescale, the integrator will go into saturation and the measurement is invalid. This situation can be avoided by configuring the delta-sigma quantizer such that, based on the bitstream, it ranges up to the largest range at a faster rate than it ranges down, for instance. For example, a delta-sigma quantizer with a certain number of settable range values may increase the range value in a non-linear way and decrease the range value in a linear way depending on the bitstream.

In various embodiments of the ADC according to the improved concept the integrator comprises a non-linear capacitor.

The use of a non-linear capacitor is another way of preventing the saturation of the integrator. For example, the non-linear capacitor may be characterized by a varying voltage-dependent capacitance, which may reduce the steepness of the increase of the integrator output signal if the analog input signal rapidly increases. Hence, the time to reach the saturation regime of the integrator is increased.

In various embodiments the quantizer further comprises a second threshold detector configured to indicate whether the integration signal is smaller or larger than a second threshold value. In such an embodiment, the RCC may be further configured to accelerate the increase of the range value based on the signal of the second threshold detector.

Another way of avoiding the saturation of the integrator is the introduction of a second threshold, at which the RCC is forced to the highest range value to operate the delta-sigma quantizer with the highest range, for example. In particular, the second threshold value is larger than the first threshold value.

The aforementioned object is further solved by a sensor arrangement comprising a photodiode and an analog-to-digital converter, ADC, based on single-bit delta-sigma quantization according to one of the embodiments described above. In such an arrangement the ADC is configured to convert an analog input signal based on a signal of the photodiode to a digital output signal.

Ambient light sensors, ALS, constitute an example, in which an auto-ranging ADC is desired. For example, the analog input signal of an ALS is the unipolar photocurrent of the photodiode. These photocurrents induced by ambient light may span several orders of magnitude when detecting light levels in almost complete darkness and those at direct sunlight, for instance.

The aforementioned object is further solved by a method for operating an analog-to-digital converter based on single-bit delta-sigma quantization, for example according to one of the embodiments described above. The method comprises generating an integrated signal by means of an integration of a difference of an analog input signal and a subtrahend signal, generating discrete bit signals of a bitstream based on comparisons between the integrated signal and a first threshold value, and generating the subtrahend signal based on the bit signals. The method further comprises adjusting, based on the bitstream, a magnitude of the subtrahend signal as a range value, assigning each of the discrete bit signals a corresponding range value and generating a digital output signal from the bitstream and from the corresponding range value for each of the discrete bit signals of the bitstream.

Further embodiments of the method become apparent to the skilled reader from the embodiments of the sensor arrangement described above.

BRIEF DESCRIPTION OF THE DRAWINGS

The following description of figures of exemplary embodiments may further illustrate and explain aspects of the improved concept. Components and parts of the converter with the same structure and the same effect, respectively, appear with equivalent reference symbols. Insofar as components and parts of the converter correspond to one

DETAILED DESCRIPTION

Figure 1:
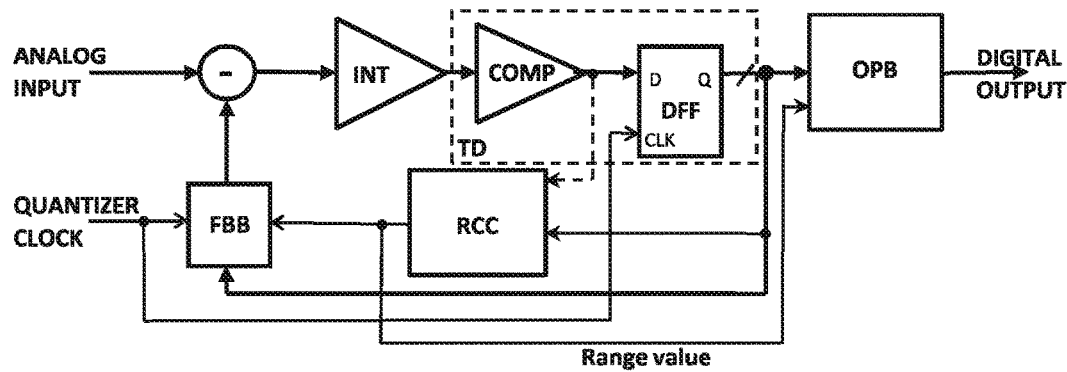
FIG. 1 shows an exemplary embodiment of the analog-to-digital converter according to the improved concept.

FIG. 1 shows an exemplary embodiment of an analog-to digital converter, ADC, based on single-bit delta-sigma quantization according to the improved concept. The ADC comprises an integrator INT receiving the difference signal generated from an analog input signal and a subtrahend signal. The integrator INT integrates said difference signal and outputs the resulting integrated signal to a threshold detector TD. The threshold detector TD comprises a comparator COMP that is configured to compare the integrated signal to a first threshold value and based on this comparison generates bit signals. The comparator output signal is a binary type signal with values of 1 or 0, depending on whether the integration signal is larger or smaller than the first threshold value. The threshold detector TD further comprises a D flip-flop DFF which is supplied with the comparator output signal and a clock rate from a quantizer clock and generates from the comparator output signal a bitstream. The clock rate may be in the order of 360 KHz and a measurement time, or integration time, may be 100 ms, such that the resulting bit stream comprises 36000 bit signals.

The ADC in this exemplary embodiment further comprises a range control circuit RCC which is supplied with the bitstream. Alternatively, the range control circuit RCC may instead be supplied directly with the comparator output signal to have a faster loopback information. The range control circuit RCC may be configured to analyze the bitstream for specific sequences and based on that adjust a magnitude of the subtrahend signal corresponding to a range value.

The ADC in this exemplary embodiment further comprises a feedback block FBB which generates the subtrahend signal based on the bit signals and the range value at the clock rate.

The ADC in this exemplary embodiment further comprises an output processing block OPB which generates from the bitstream and the range values a digital output signal. Each bit signal of the bitstream thereby is converted by means of an associated range value.

Figure 2:
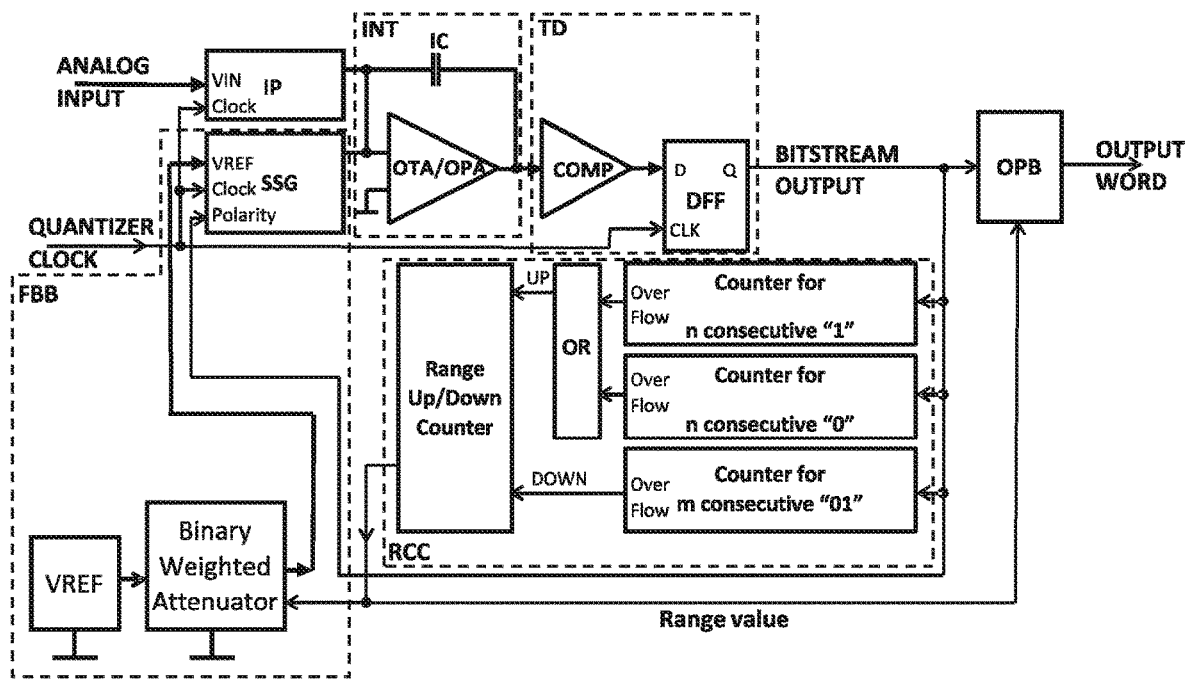
FIG. 2 shows a further exemplary embodiment of the ADC according to the improved concept.

FIG. 2 shows a further exemplary embodiment of the ADC according to the improved concept that is based on the embodiment of FIG. 1. In this embodiment, the ADC realizes the auto-ranging by means of an attenuated reference voltage as subtrahend signal. In this example, the feedback block FBB comprises a reference voltage source VREF and a binary weighted attenuator configured to attenuate the constant reference voltage based on a binary input from the range control circuit RCC. The feedback block FBB further comprises a subtrahend signal generator SSG generating the subtrahend signal from the attenuated reference voltage and a polarity based on the bit signals at a clock rate from the quantizer clock.

The binary input for the attenuator corresponds to the signal generated by the range control circuit RCC. For example, the binary weighted attenuator may increase or decrease the attenuation factor according to the range value applied by the range control circuit RCC. The fixed factor may be 2, for instance. The range value may in this example correspond to an output value of an up/down counter inside the range control circuit RCC, which gets increased or decreased by a supervisor of the bitstream sequence.

The bitstream supervisor inside the range control circuit RCC in this example comprises a set of three counters each analyzing the bitstream for certain sequences. The first counter may be configured to output an overflow signal if a sequence of n consecutive bit signals of value '1' are detected in the bitstream. Likewise, the second counter may output an overflow signal for a sequence of n consecutive bit signals of value '0' in the bitstream. The third detector may analyze the bitstream for a m consecutive alternating bit signals in the bitstream, for example m times '01', and based on this generate an overflow signal. Herein, n and m are integer numbers and may both equal to 3, for example.

The range control circuit further comprises a range up/down counter configured to generate the range value for the attenuator. If an overflow signal from the first or second counter is received, the range up/down counter may for example increment its counter state by 1, while the up/down counter decrements its counter state by 1 if an overflow signal from the third counter is detected.

The ADC in this example further comprises an input processor IP configured to pass an analog input signal to the integrator INT at the clock rate. To this end, the input processor IP may comprise a switched capacitor configured to perform discrete-time signal conversion from an input voltage to input charge.

The integrator may comprise an operational amplifier OPA or an operational transconductance amplifier OTA and an integration capacitor IC and integrates a voltage difference signal generated from the analog input signal and the subtrahend signal.

The output processing block in this example may be configured to perform a multiplication of each bit signal of the bitstream by the range value. For example, each bit of the bitstream gets shifted to a significance corresponding to the actual range value to reflect the delta portion used for generating the respective bit. The result of this is a digital output signal as a binary output word.

Figure 3:
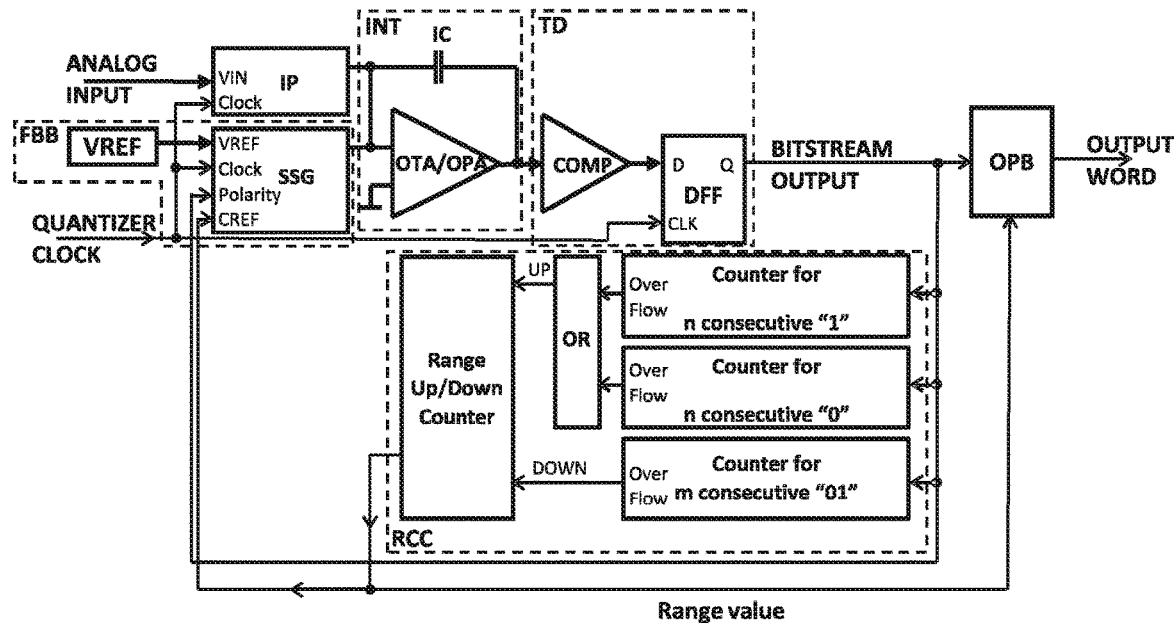
FIG. 3 shows a further exemplary embodiment of the ADC according to the improved concept.

FIG. 3 shows a further exemplary embodiment of the ADC according to the improved concept that is based on the embodiment of FIG. 1 and partially on the embodiment of FIG. 2. Instead of attenuation of a reference voltage to adjust the magnitude of the subtrahend signal as in the previous figure, the magnitude of the subtrahend signal is adjusted via a variable capacitance. For example, the feedback block FBB may comprise an attenuator which is binary weighted and configured to adjust a reference capacitor CREF in the path of a reference voltage to effectively adjust the magnitude of the latter. The concept of the remaining components of this embodiment are analogous to that described in FIG. 2.

The examples described in FIGS. 2 and 3 are optional examples for bipolar analog input signals. A certain number of consecutive '0' or '1' in the bitstream indicate a large negative or positive signal outside the currently set range of the ADC, respectively. Therefore, an increase of the subtrahend signal, i.e. a lower attenuation of the reference voltage, is required. A sequence of alternating values in the bitstream indicate a signal well within the currently set range of the ADC and allow for a decrease of the subtrahend signal, i.e. a higher attenuation of the reference voltage.

Figure 4:
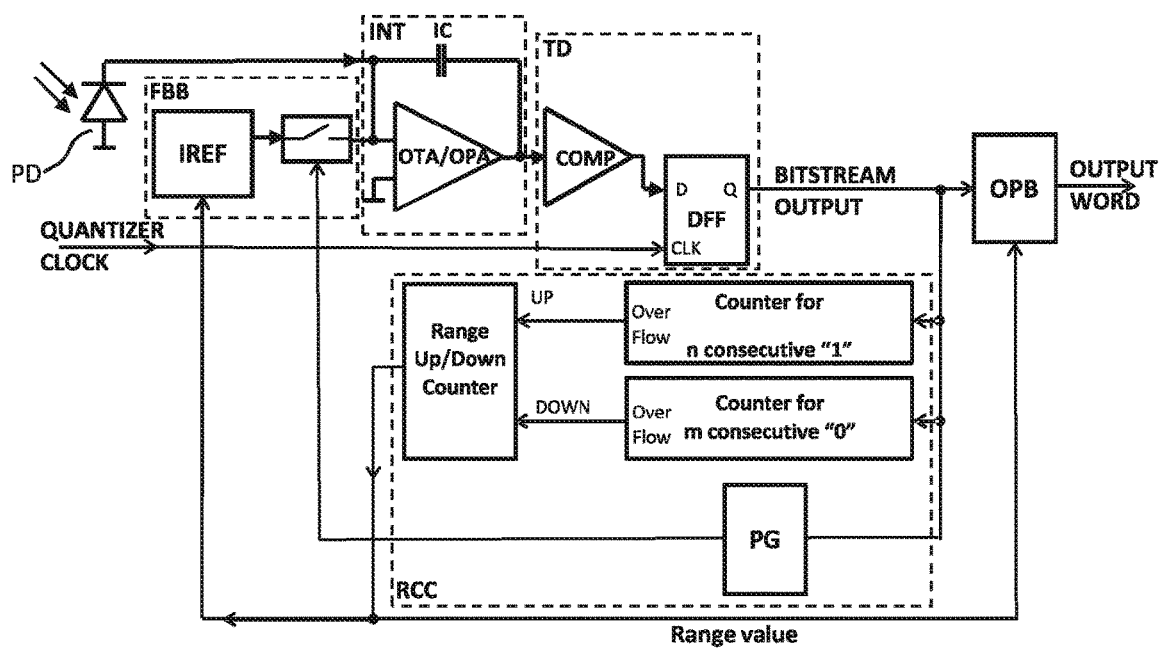
FIG. 4 shows an exemplary embodiment of the sensor arrangement comprising an ADC according to the improved concept.

FIG. 4 shows an exemplary embodiment of a sensor arrangement according to the improved concept that is based on the embodiment of FIG. 1. The sensor arrangement comprises a photodiode PD which generates a photocurrent corresponding to an intensity of incident light. In contrast to the embodiments described in FIGS. 2 and 3, the photocurrent constitutes a unipolar positive analog input signal.

The range control circuit RCC for unipolar input signals optionally comprises two counters for the analysis of the bitstream. The first counter may be configured to analyze the bitstream for n consecutive bit signals of value '1', while the second counter may analyze the bitstream form consecutive bit signals of value '0'. A consecutive series of bit signal value of '1' may indicate a large input signal level at the border or outside the currently set range of the ADC, which has to lead to an increase of the range value, while a value of '0' implies a small input signal level such that with a consecutive series of '0' bits the range can be decreased, for example. An overflow signal from the first or the second counter increments or decrements the range up/down counter and thus the range value of the ADC, respectively.

The binary signal value in this example adjusts a magnitude of a reference current from a reference current source IREF in the feedback block FBB. For example, the magnitude of the reference current may be stepwise increased and decreased to a fixed value for each range value.

A pulse generator PG in the range control circuit RCC may operate a switch based on the bit signals of the bitstream. For positive unipolar input signals, a subtrahend signal may be subtracted only if the integrator output reaches the comparator threshold level.

Figure 5:
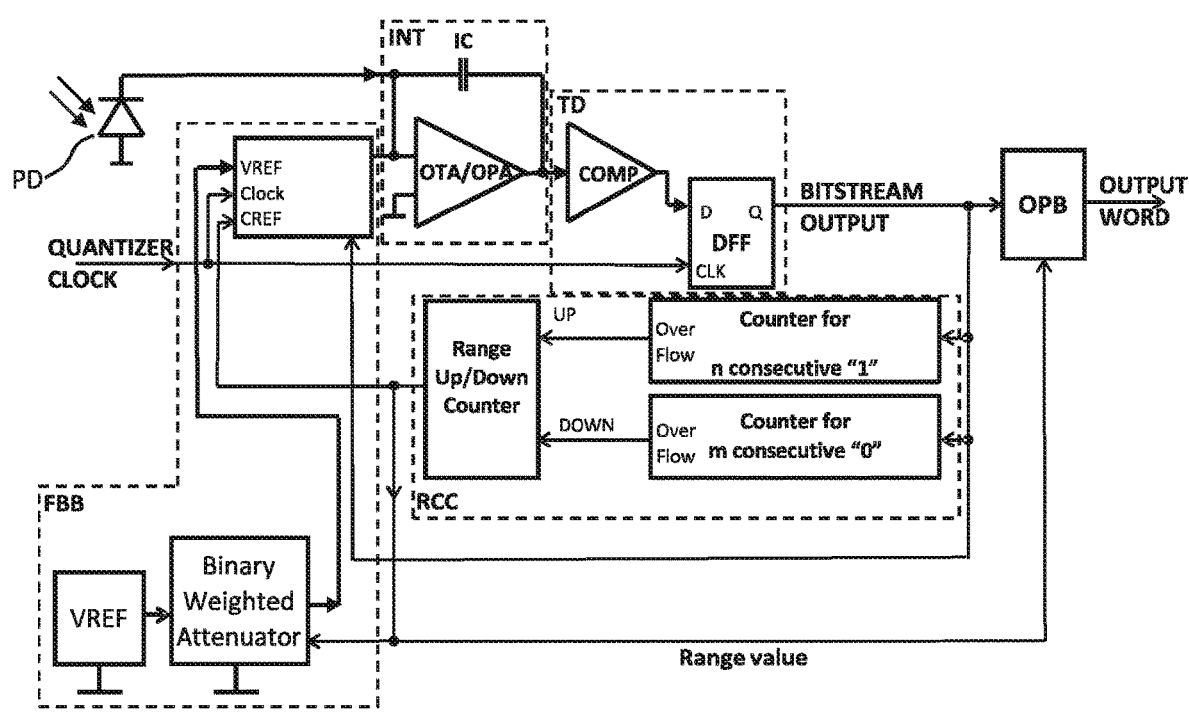
FIG. 5 shows a further exemplary embodiment of the sensor arrangement comprising an ADC according to the improved concept.

FIG. 5 shows a further exemplary embodiment of the sensor arrangement according to the improved concept that is based on the embodiment of FIG. 1 and partially on the embodiment of FIG. 4. Instead of adjusting the magnitude a reference current as the subtrahend signal, in this embodiment the magnitude of the subtrahend signal is adjusted via an adjustable attenuation of a reference voltage from a reference voltage source VREF in combination with an adjustable reference capacitor CREF in this example.

To this end, the feedback block FBB may comprise an attenuator which is binary weighted and configured to adjust a reference voltage as well as a reference capacitance of the subtrahend signal generator SGG. Each binary level of the range value corresponds to a defined voltage reference level and a defined reference capacitor size.

Figure 6:
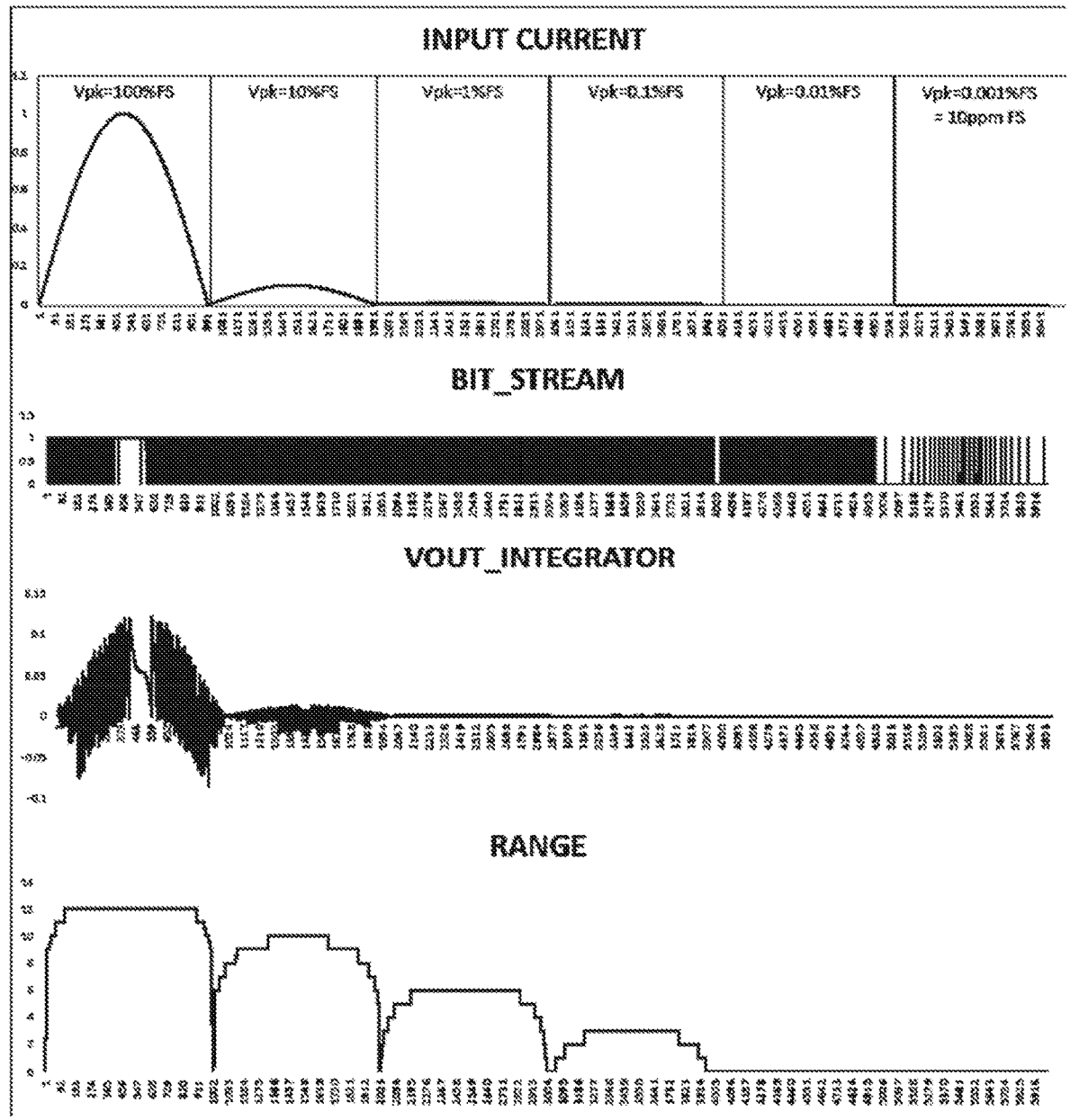
FIG. 6 shows an exemplary signal diagram of the method to operate an ADC according to the improved concept.

FIG. 6 shows exemplary signals of an ADC with auto-ranging according to the improved concept. The topmost graph shows the magnitude of an analog input signal versus time in units of inversed clock rate. The input signal is chosen to be unipolar positive and represents a half-sine wave. After each period, the maximum amplitude of the input signal is decreased by an order of magnitude. The second graph shows the corresponding bitstream, indicating that, even for the smallest amplitude of 10 ppm of the initial amplitude, still pulses are being counted, i.e. bit signal values of '1' are being registered. The third graph shows the magnitude of the integrated signal, while the bottommost graph shows the range value. The ADC in this example comprises 13 ranges, wherein 12 indicates the largest, or coarsest, range and 0 the smallest, or finest. The automatic adjustment of the range for large variations of the magnitude of the input signal is clearly discernable.

Figure 7:
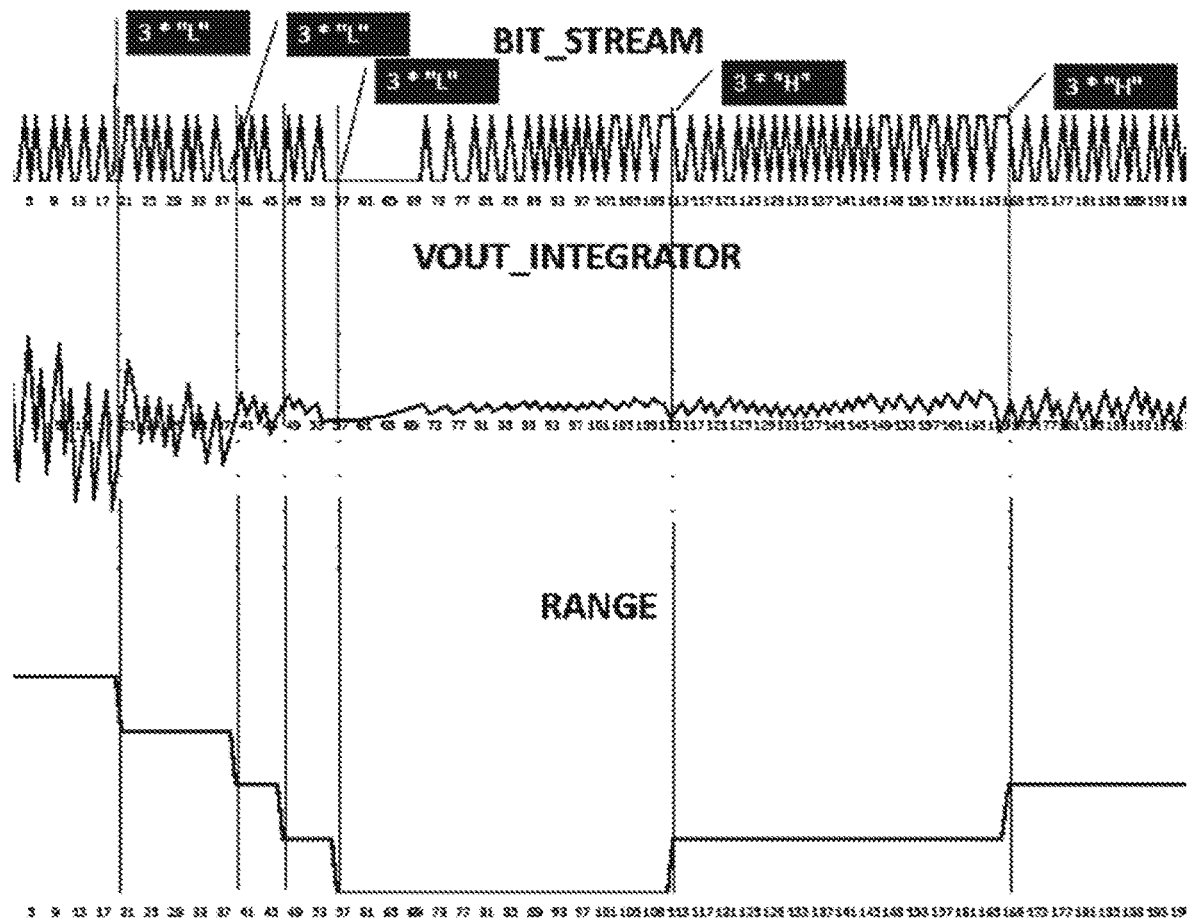
FIG. 7 shows a further exemplary signal diagram of the method according to the improved concept.

FIG. 7 shows further exemplary signals of an ADC with auto-ranging according to the improved concept. In this figure, the top graph shows an exploded view of the bitstream, the center graph shows the output signal of the integrator stage and the bottom graph shows the range value. Vertical lines indicate the automatic switching of the range for a unipolar input signal. For example, the ADC may be configured to decrease the range, i.e. decrease the range value in this example, if three consecutive low binary values, 'L' or '0', are detected in the bitstream and to increase the range for three consecutive high values, 'H' or '1'.

A critical aspect of the auto-ranging of the ADC may be the relation between the speed at which the level of the input signal changes and the speed at which the ADC adjusts its range, for example with an input signal having a high dynamic range. In particular, if the ADC is configured to increase the range too slow when the input signal level is rising, the integrator INT may eventually saturate rendering the measurement invalid.

For a given maximum input signal, the saturation time of the integrator INT is defined by the integration capacitor IC. A large capacitance prevents the saturation of the integrator INT but has the drawback of small voltage steps per delta portion of the ADC at the output of the integrator INT. Particularly for the smallest range setting, i.e. the highest sensitivity regime of the ADC, small voltages make it difficult to discern actual signal from noise that may be of the same order of magnitude. Hence, the size of the integration capacitor IC is a trade-off between the prevention of saturation and large enough voltage levels at the output of the integrator INT.

An exemplary improved solution for preventing the saturation of the integrator INT is the employment of an aggressive ranging-up of the ADC when a rise of the input signal is detected. One signature of a too large input signal is a series of consecutive bit signals of value '1' in the bitstream, both for bipolar and unipolar positive input signals. However, a series of consecutive '1' in the bitstream is an example for a range-up criterion. For instance for bipolar signals, a series of consecutive '0' in the bitstream implies a too large negative signal level outside the currently set range of the ADC and therefore constitutes an equivalent range-up criterion.

As proposed above, the ADC may be configured to increase the range of the ADC if a certain number of consecutive '1' are detected in the bitstream. If after ranging up once another '1' is detected as the next bit signal in the bitstream, the circuit might further increase its range another time and so on. The table below shows this linear range-up in the second column for an ADC comprising eleven discrete range levels numbered from 0 (lowest range, highest sensitivity) to 11 (highest range, lowest sensitivity).

| Number of consecutive 1-bits | Linear Range Increment | Aggressive Range Increment | Aggressive Range Increment 2 |
| --- | --- | --- | --- |
| 2 | — | — | +1 (0 + 1 = 1) |
| 3 | +1 (0 + 1 = 1) | +1 (0 + 1 = 1) | +2 (1 + 2 = 3) |

-continued

| Number of consecutive 1-bits | Linear Range Increment | Aggressive Range Increment | Aggressive Range Increment 2 |
|---|---|---|---|
| 4 | +1 (1 + 1 = 2) | +2 (1 + 2 = 3) | +3 (3 + 3 = 6) |
| 5 | +1 (2 + 1 = 3) | +3 (3 + 3 = 6) | +4 (6 + 4 = 10) |
| 6 | +1 (3 + 1 = 4) | +4 (6 + 4 = 10) | |
| 7 | +1 (4 + 1 = 5) | | |
| 8 | +1 (5 + 1 = 6) | | |
| 9 | +1 (6 + 1 = 7) | | |
| 10 | +1 (7 + 1 = 8) | | |
| 11 | +1 (8 + 1 = 9) | | |
| 12 | +1 (9 + 1 = 10) | | |

For rapidly increasing input signals, this method might be too slow, however, to avoid the saturation of the integrator INT. For example, the ADC can instead be configured to increase the range more aggressively, as shown in the third and fourth column of the table for two exemplary schemes. While the ranging down of the ADC may still be performed in the linear manner, the ADC may increase the range by more than one level at once after the first increase. The highest range level of this exemplary ADC may be reached after six or five consecutive bit signals of value '1' in the bitstream instead of after 12, for example. An alternative exemplary solution for preventing the saturation of the integrator INT is by employing a non-linear capacitor as the integration capacitor. The non-linear capacitor may be characterized by a decreasing steepness of the integrator output signal with increasing voltage across the capacitor. With this, the saturation time of the integrator INT for a given level of the input signal can be increased.

A third exemplary solution for preventing the saturation of the integrator INT is to implement a second threshold detector in the ADC comparing the output of the integrator INT to a second threshold value, which may be larger than the first threshold signal, for instance. For example, if the output of the integrator is detected to be larger than the second threshold value, the ADC may be configured to directly select the highest range setting.

We claim:

1. An analog-to-digital converter, ADC, based on single-bit delta-sigma quantization configured to convert an analog input signal to a digital output signal, the ADC comprising
an integrator configured to generate an integrated signal by means of an integration of a difference of the input signal and a subtrahend signal;
a threshold detector configured to generate discrete bit signals of a bitstream, the bit signals indicating whether the integration signal is smaller or larger than a first threshold value;
a feedback block configured to generate the subtrahend signal based on the bit signals;
a range control circuit configured to adjust based on the bitstream a magnitude of the subtrahend signal corresponding to a range value using a factor of a set of fixed factors and to provide for each of the discrete bit signals an associated range value to an output processing block; and
the output processing block, configured to generate the digital output signal from the bitstream and from the associated range value for each of the discrete bit signals of the bitstream.

2. The ADC according to claim 1, wherein the bitstream is generated within a predefined measurement time and the discrete bit signals of the bitstream are generated at a predefined clock rate.

3. The ADC according to claim 1, wherein the generation of the digital output signal comprises multiplying each of the discrete bit signals of the bitstream with a factor corresponding to the associated range value.

4. The ADC according to claim 1, wherein the range control circuit is further configured to adjust the range value using a factor of a set of powers of 2.

5. The ADC according to claim 1, wherein
the analog input signal is bipolar; and
the range control circuit is further configured to
increase the range value if a sequence of the bitstream comprises a number of consecutive high values and/or a number of consecutive low values; and
to decrease the range value if the sequence comprises a number of consecutive alternating low and high values and/or a number of consecutive alternating high and low values.

6. The ADC according to claim 5, wherein the range control circuit is further configured to set a polarity of the subtrahend signal based on the bitstream.

7. The ADC according to claim 1, wherein
the analog input signal is unipolar; and
the range control circuit is further configured to
increase the range value if a sequence of the bitstream comprises a number of consecutive high values; and
to decrease the range value if the sequence comprises a number of consecutive low values.

8. The ADC according to claim 1, wherein the range control circuit is further configured to predetermine an initial value for the range value.

9. The ADC according to claim 1, wherein the range control circuit is further configured to increase and decrease the range value in a different manner.

10. The ADC according to claim 1, wherein the integrator comprises a non-linear capacitor.

11. The ADC according to claim 1, wherein
the ADC further comprises a second threshold detector configured to generate discrete second bit signals of a second bitstream, the second bit signals indicating whether the integration signal is smaller or larger than a second threshold value; and
the range control circuit is further configured to adjust the range value based on the second bitstream.

12. A sensor arrangement comprising a photodiode and an analog-to digital converter, ADC, based on single-bit delta-sigma quantization according to claim 1, wherein the ADC is configured to convert an analog signal based on a photo current of the photodiode to a digital signal.

13. A method for operating an analog-to-digital converter, ADC, based on single-bit delta-sigma quantization, the method comprising
generating an integrated signal by means of an integration of a difference of an analog input signal and a subtrahend signal;
generating discrete bit signals of a bitstream based on comparisons between the integrated signal and a first threshold value;
generating the subtrahend signal based on the bit signals;
adjusting based on the bitstream a magnitude of the subtrahend signal corresponding to a range value using a factor of a set of fixed factors;
assigning each of the discrete bit signals an associated range value; and
generating a digital output signal from the bitstream and from the associated range value for each of the discrete bit signals of the bitstream.

14. The method according to claim 13, further comprising an increase and decrease of the range value based on the bitstream using a factor of a set of fixed factors.

15. The method according to claim 13, wherein the increase and decrease of the range value is performed in a different manner.

16. The method according to claim 13, further comprising an increase and decrease of the range value based on the bitstream using a factor of a set of powers of 2.

\* \* \* \* \*